(12) United States Patent
Lai et al.

(10) Patent No.: US 8,083,191 B2
(45) Date of Patent: Dec. 27, 2011

(54) STABILIZING APPARATUS FOR ELECTRONIC DEVICE

(75) Inventors: Hsiu-Chang Lai, Taipei Hsien (TW); Ke Sun, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1125 days.

(21) Appl. No.: 11/862,200

(22) Filed: Sep. 27, 2007

(65) Prior Publication Data

US 2008/0218948 A1     Sep. 11, 2008

(30) Foreign Application Priority Data

Mar. 5, 2007  (CN) .......................... 2007 1 0200248

(51) Int. Cl.
*A47B 91/00*  (2006.01)
*F16M 11/24*  (2006.01)

(52) U.S. Cl. .................. 248/188.2; 651/653; 312/351.5; 312/351.13

(58) Field of Classification Search ............... 248/188.1, 248/188.3, 653, 188.2, 188.5, 644, 651, 654, 248/676, 677, 295.11, 200.1, 201, 207, 354.1; 188/5, 2 F; 280/43.24, 79.11, 79.2; 312/351.1, 351.5–351.9, 223.1, 351.13; 182/69.1, 69.4, 69.5, 69.6, 141; 187/269; 254/122, 123, 124, 116

See application file for complete search history.

(56) References Cited

U.S. PATENT DOCUMENTS

| 2,475,130 | A | * | 7/1949 | Davis ................................. 188/5 |
| 4,064,591 | A | * | 12/1977 | Hutchison ......................... 16/99 |
| 4,073,369 | A | * | 2/1978 | Nordskog ........................ 188/5 |
| 4,655,466 | A | | 4/1987 | Hanaoka |
| 5,323,879 | A | * | 6/1994 | Poulin ............................ 188/19 |

FOREIGN PATENT DOCUMENTS

JP    2001238733 A    9/2001

* cited by examiner

*Primary Examiner* — Tan Le
(74) *Attorney, Agent, or Firm* — Altis Law Group, Inc.

(57) ABSTRACT

A stabilizing apparatus for preventing a server cabinet from moving, includes two mounting members oppositely mounted to the server cabinet, two support members slidably mounted to the mounting members respectively, an operating member, and two locating assemblies. Each locating assembly is mounted to a corresponding support member, the operating member, and a corresponding mounting member respectively. The operating member moves down to drive the corresponding locating assemblies respectively to move the corresponding support members down, until the support members stand on a supporting plane.

12 Claims, 6 Drawing Sheets

STABILIZING APPARATUS FOR ELECTRONIC DEVICE

BACKGROUND

1. Field of the Invention

The present invention relates to stabilizers, and more particularly to a stabilizer attached to a server cabinet for preventing the cabinet from moving.

2. Description of related art

A large device, such as a server, is too weighty to move easily from one place to another place. Typically, wheels are attached to the bottom of the device to make it easier to move but may lead to the device being unstable and too easily moved.

Conventional stabilizers for a device include feet screwed into a bottom portion thereof. When the device needs to be moved, the feet are screwed in far enough to lose contact with a supporting surface for the device. When the device needs to be stably settled in place, the feet are unscrewed enough to firmly contact the supporting surface. Thus, the device is settled. Although the feet can stabilize the device, it is inconvenient for users to screw and unscrew the feet at the bottom of the device.

What is needed, therefore, is a stabilizing apparatus which is attached to a device for conveniently preventing the device from moving.

SUMMARY

An exemplary stabilizing apparatus for preventing a server cabinet from moving, includes two mounting members oppositely mounted to the cabinet, two support members slidably mounted to the mounting members respectively, an operating member, and two locating assemblies. Each locating assembly is mounted to a corresponding support member, the operating member, and a corresponding mounting member. The operating member moves down to drive the corresponding locating assemblies respectively to move the corresponding support members down, until the support members stand on a supporting plane.

Other advantages and novel features will become more apparent from the following detailed description of an embodiment when taken in conjunction with the accompanying drawings, in which:

DETAILED DESCRIPTION

Figure 1:
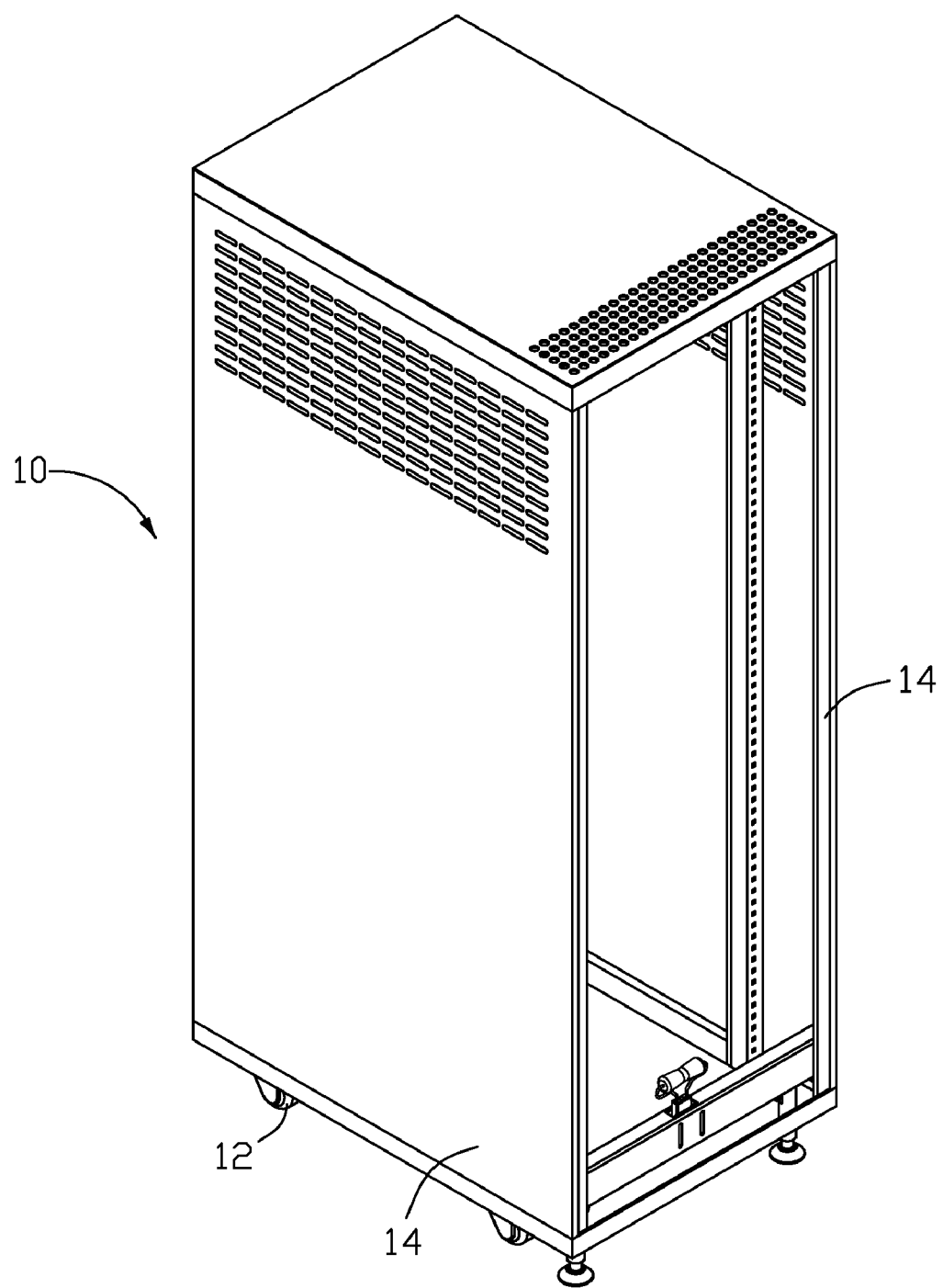
FIG. 1 is an assembled, isometric view of a stabilizing apparatus in accordance with an embodiment of the present invention, and a device.
Figure 2:
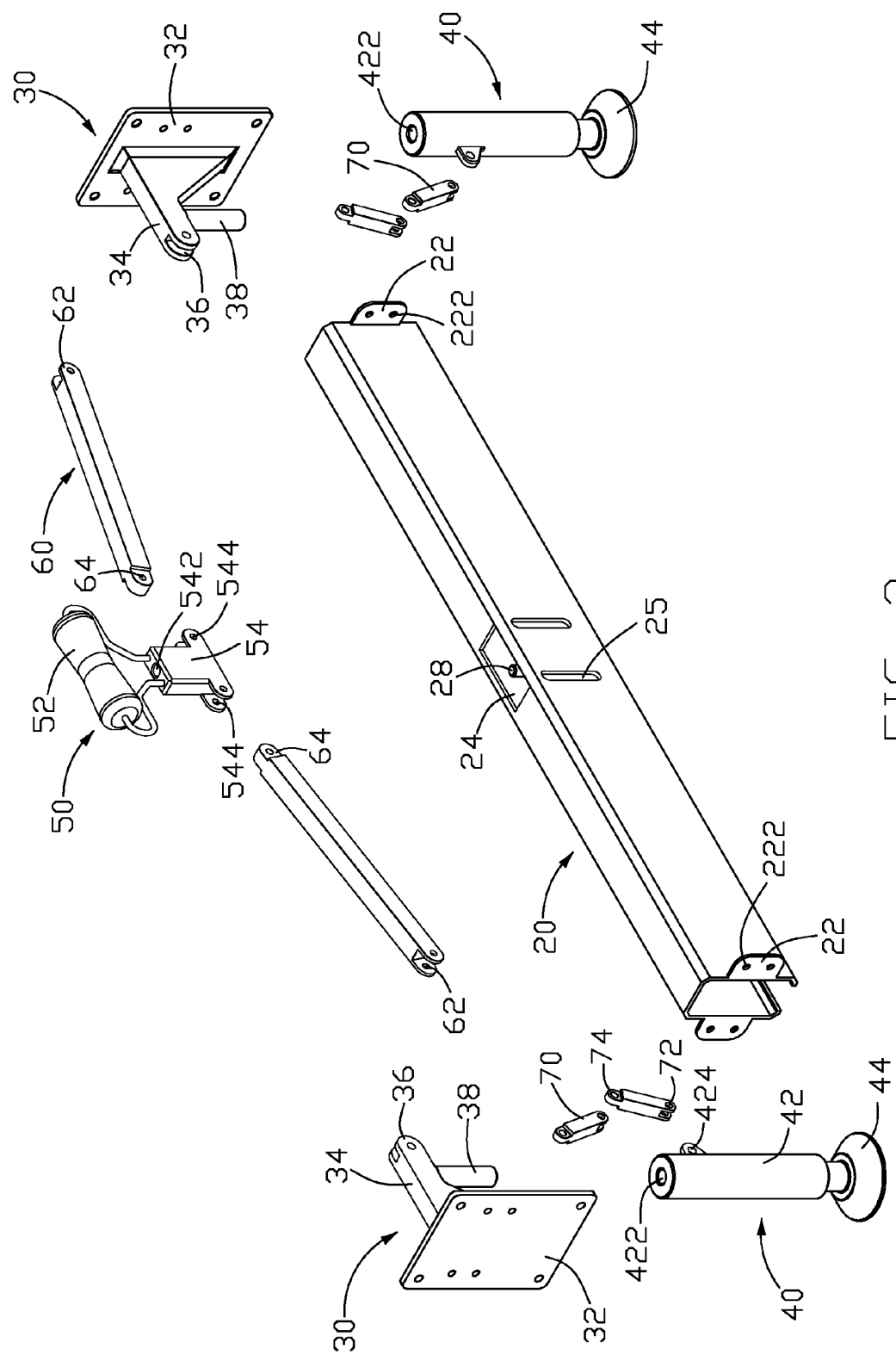
FIG. 2 is an exploded, isometric view of the stabilizing apparatus of FIG. 1, the stabilizing apparatus including a girder.

Referring to FIGS. 1 and 2, a stabilizing apparatus for preventing a device from moving includes a girder 20, two mounting members 30, two support members 40, two locating assemblies, and an operating member 50. In this embodiment, the device is a server cabinet 10. The server cabinet 10 includes a bottom wall (not labeled), two opposite sidewalls 14, and a plurality of wheels 12 mounted to the bottom wall.

Figure 3:
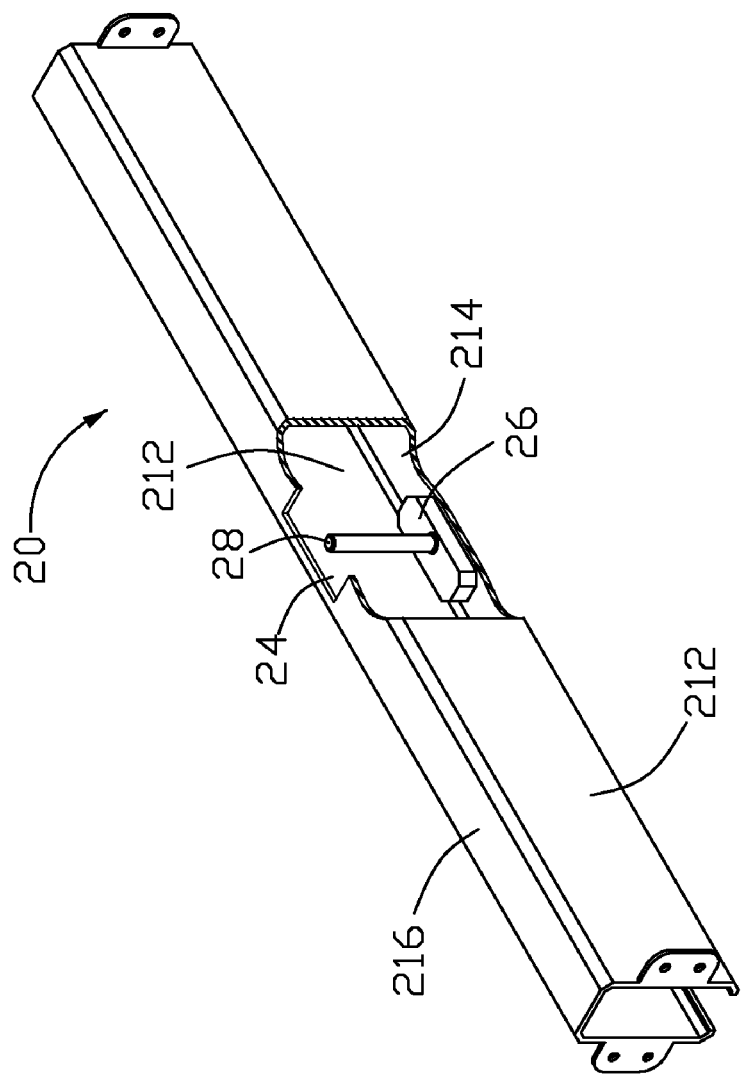
FIG. 3 is a partially cutaway view of the girder of FIG. 2.

Referring also to FIG. 3, the girder 20 is generally cannular-shaped and has a rectangular cross section. The girder 20 includes two parallel side plates 212, a bottom plate 214 connecting bottoms of the side plates 212, and a top plate 216 connecting tops of the side plates 212. A mounting piece 22 extends from each end of each side plate 212. Two mounting holes 222 are defined in each mounting piece 22. A rectangular opening 24 is defined in the top plate 216. Two through holes 25 are defined in a side plate 212 in the vicinity of the opening 24. A protrusion 26 protrudes up from the bottom plate 214, corresponding to the opening 24. A pole 28 extends up from the protrusion 26.

Each mounting member 30 includes an upright mounting plate 32, and a cantilever 34 perpendicularly extending from the mounting plate 32. A plurality of mounting holes and a plurality of fixing holes are defined in the mounting plate 32. A female connecting portion 36 is formed at the free end of the cantilever 34. A pole 38 extends down from the cantilever 34 in the vicinity of the female connecting portion 36.

Each support member 40 includes a columnar main body 42, and a foot 44 mounted to a bottom of the main body 42. A sliding slot 422 is defined in the main body 42 along an axial direction of the main body 42. A male connecting portion 424 is formed at an upper portion of the main body 42.

The operating member 50 includes a handle 52, and a sliding portion 54 mounted to a bottom of the handle 52. A through hole 542 is defined in the sliding portion 54 from top to bottom. Two female connecting portions 544 extend outward from opposite ends of a lower portion of the sliding portion 54.

Each locating assembly includes an arm 60, and two pivot members 70 pivotably connected to each other. The arm 60 is connected to a conjunction of the two pivot members 70. Each arm 60 includes a female connecting portion 62, and a male connecting portion 64 formed at two opposite ends thereof, respectively. Each pivot member 70 includes a female connecting portion 72, and a male connecting portion 74 formed at two opposite ends thereof, respectively.

Figure 4:
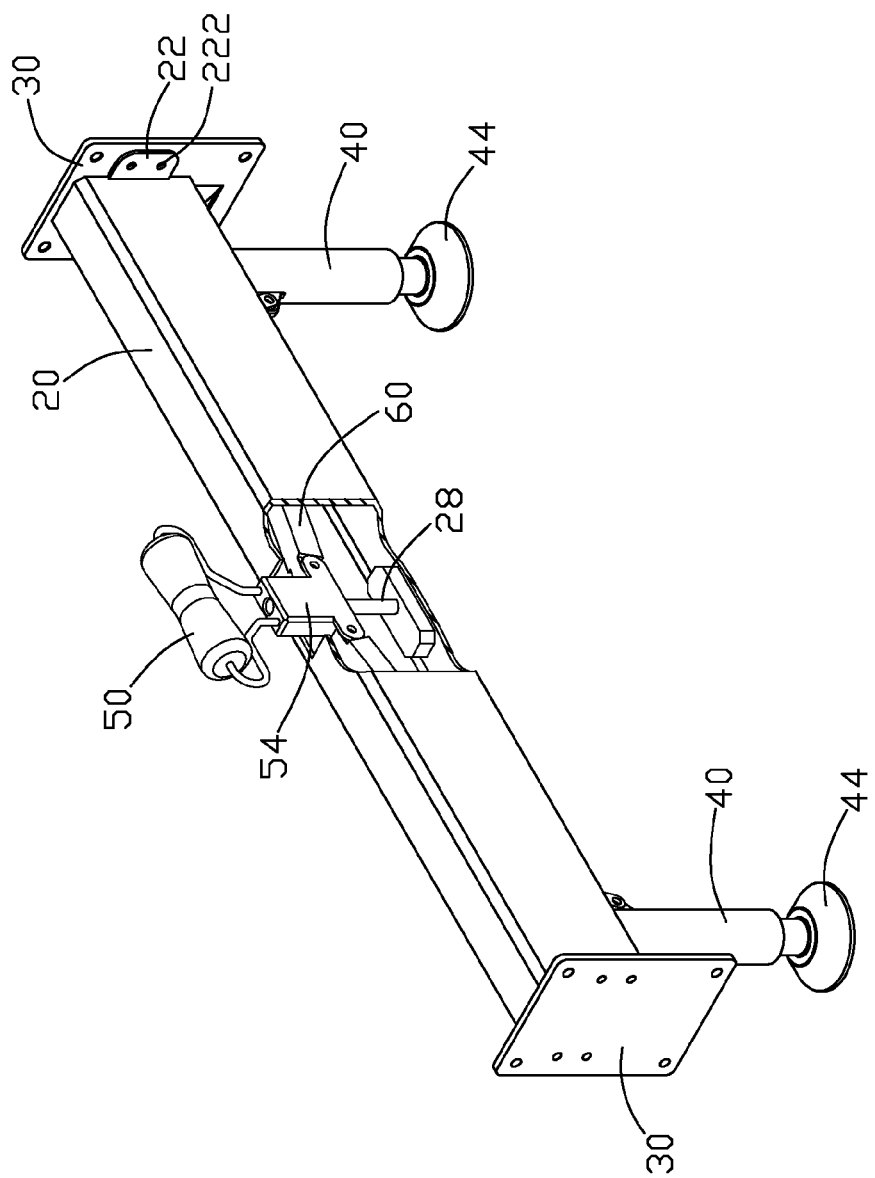
FIG. 4 is an assembled view of FIG. 2.

Referring also to FIG. 4, in assembly, the main body 42 of each supporting member 40 slidably fits about the sliding pole 38 of a corresponding mounting member 30 via the sliding slot 422 thereof. The two pivot members 70 of each locating assembly are pivotably mounted to each other via the female connecting portion 72 of one of the two pivot members 70 and the male connecting portion 74 of the other one of the two pivot members 70. Two free ends of each two combined pivot members 70 are respectively pivotably mounted to the female connecting portion 36 of a corresponding mounting member 30 and the male connecting portion 424 of a corresponding supporting member 40. The sliding portion 54 of the operating member 50 is put into the opening 24 of the girder 20. The pole 28 of the girder 20 is inserted into the through hole 542 of the sliding portion 54. The arms 60 are received in the girder 20. Each arm 60 is connected to a conjunction of two corresponding pivot members 70 via the female connecting portion 62 thereof to form one of the locating assemblies. The male connecting portion 64 of each arm 60 is connected to a corresponding female connecting portion 544 of the sliding portion 54. The through holes 25 of the girder 20 are defined for a tool, such as a screwdriver passing through to mount the male connecting portions 64 of the arms 60 to the corresponding female connecting portions 544 of the operating member 50. Two rivets (not shown in figure) extend through the corresponding mounting holes 222 of each mounting piece 22 and engage in the corresponding mounting holes of a corresponding mounting plate 32 for mounting the mounting member 30 to a corresponding end of the girder 20. A plurality of rivets (not shown in figure) extends through the fixing holes of the mounting plates 32 to respectively mount the mounting members 30 to the sidewalls 14 of the device 10.

Figure 5:
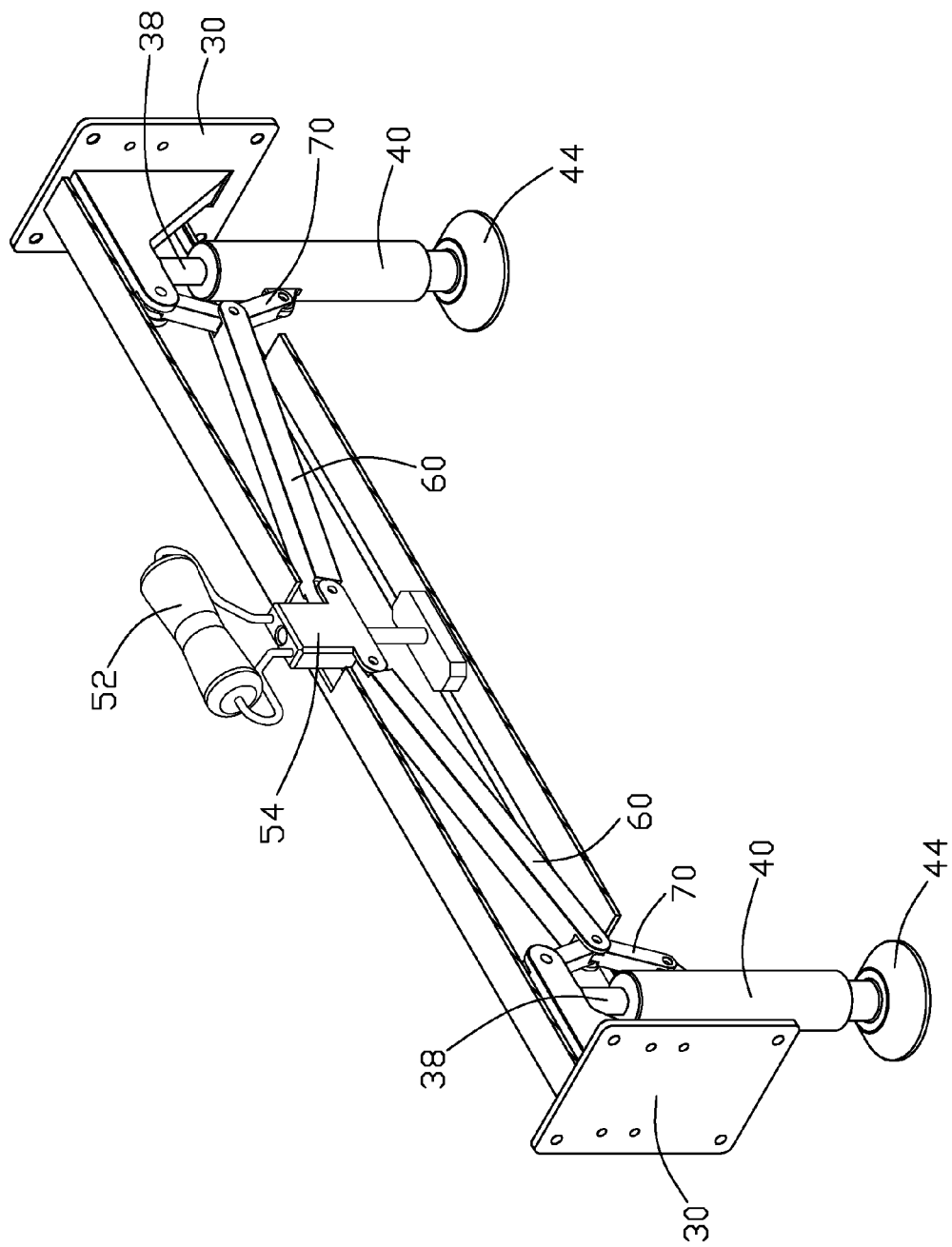
FIGS. 5 and 6 are similar to FIG. 4, respectively showing the stabilizing apparatus in two states.

Referring also to FIG. 5, when the device 10 needs to be moved to another position, the handle 52 of the operating member 50 is moved up. The sliding portion 54 drives the adjacent end of each of the arms 60 to move up. Each of the arms 60 drives two corresponding pivot members 70 to reduce an angle between the two pivot members 70. The pivot members 70 drive the corresponding supporting members 40 to move up, until the feet 44 of the supporting members 40 depart from a supporting plane, such as the floor. Thus, the device 10 is easily to be moved via the wheels 12.

Figure 6:
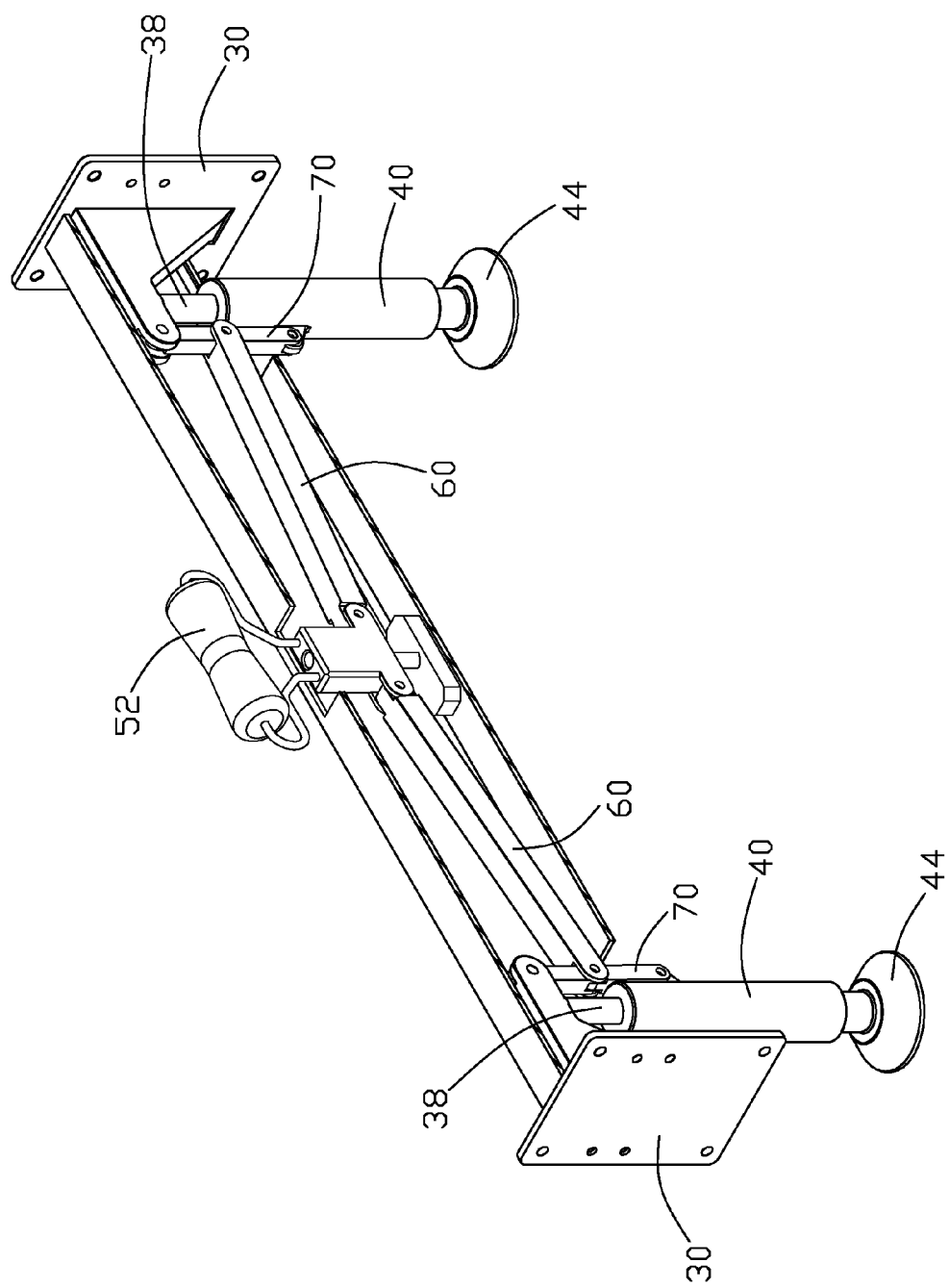

Referring also to FIG. 6, when the device 10 needs to be stably settled, the handle 52 of the operating member 50 is moved down to drive the arms 60 to move down. Each arm 60 drives two corresponding pivot members 70 to increase the angle between the two pivot members 70. The pivot members 70 drive the corresponding supporting members 40 to move down, until the angle between the two pivot members 70 is about 180 degrees. Thus, the feet 44 of the supporting members 40 stand on the floor. Therefore, the device 10 is prevented from moving.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A stabilizing apparatus for preventing a server cabinet from moving, comprising:
   two mounting members configured to oppositely mount to the server cabinet;
   two support members slidably mounted to the mounting members respectively;
   an operating member; and
   two locating assemblies, each of the two locating assemblies pivotably mounted to a corresponding support member and a corresponding mounting member, wherein the operating member is sandwiched between the two locating assemblies and pivotably attached to the two locating assemblies;
   wherein the operating member is movable down to drive the corresponding locating assemblies to move the corresponding support members down such that the support members stand on a supporting plane to thereby prevent the server cabinet from moving along the supporting plane.

2. The stabilizing apparatus as claimed in claim 1, further comprising a girder member, wherein two ends of the girder member are mounted to the mounting members respectively.

3. The stabilizing apparatus as claimed in claim 2, wherein the girder member is generally cannular-shaped, an opening is defined in a top wall of the girder member, a pole extends up from a bottom of the girder member, the operating member extends through the opening and fits about the pole.

4. The stabilizing apparatus as claimed in claim 1, wherein each of the support members defines a sliding slot along an up-and-down direction, a pole extends from each mounting member to be received in the sliding slot of the support member, the pole being slidable in the sliding slot along the up-and-down direction.

5. The stabilizing apparatus as claimed in claim 1, wherein each of the locating assemblies comprises two pivot members pivotably connected to each other in series, and an arm with one end pivotably connected to a conjunction of the two pivot members and the other end pivotably mounted to the operating member.

6. The stabilizing apparatus as claimed in claim 5, wherein each of the mounting members has a cantilever, a female connecting portion is formed at a free end of the cantilever, a male connecting portion is formed on each of the support members, a female connecting portion is formed from the operating member, three free ends of the locating assembly are respectively pivotably mounted to the female connecting portion of a corresponding mounting member, the male connecting portion of a corresponding support member, and the female connecting portion of the operating member.

7. The stabilizing apparatus as claimed in claim 5, wherein each of the pivot members comprises a female connecting portion and a male connecting portion formed at opposite ends thereof.

8. The stabilizing apparatus as claimed in claim 6, wherein the male connecting portion is formed at an upper portion of the main body of the supporting member.

9. The stabilizing apparatus as claimed in claim 1, wherein the operating member simultaneously pivots the two locating assemblies to move the two support members down on the supporting plane.

10. The stabilizing apparatus as claimed in claim 1, wherein two locating assemblies are respectively and pivotably attached to two opposite ends of the operating member.

11. A stabilizing apparatus assembly comprising:
    a server cabinet comprising a bottom wall with a plurality of wheels installed thereon configured to slidably support the server cabinet on a supporting plane; and
    a stabilizing apparatus arranged on the server cabinet, the stabilizing apparatus comprising a mounting member fixed to the server cabinet, a supporting member slidably mounted to the mounting member, an operating member, and a connecting assembly comprising three sections each with opposite first and second ends, the first ends of the three sections respectively pivotably connected to the operating member, the support member and the mounting member and the second end of each of the three sections pivotably connected to the second ends of the other two sections such that the operating member is operable to allow the connecting assembly to slide the support member relative to the mounting member between an extended position where the support member stands on the supporting plane to block the wheel of the server cabinet from sliding along the supporting plane and a retracted position where the support member departs from the floor to allow the wheel of the server cabinet sliding along the floor.

12. The stabilizing apparatus assembly as claimed in claim 11, wherein the stabilizing apparatus further comprises a girder fixed to the mounting member, the operating member is slidably mounted to the girder in an up-and-down direction perpendicular to the supporting plane, when the operating member is slid in the up-and-down direction the second ends of the three sections of the connecting assembly pivot about one of the first ends, connected to the mounting member, of the three sections.

* * * * *